United States Patent
Tsukimori et al.

(10) Patent No.: US 6,708,304 B1
(45) Date of Patent: Mar. 16, 2004

(54) SEMICONDUCTOR DEVICE

(75) Inventors: Akifumi Tsukimori, Kwasaki (JP); Ikuya Kawasaki, Kodaira (JP); Shinichi Yoshioka, Tokyo (JP); Koki Noguchi, Tokyo (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 09/646,220

(22) PCT Filed: Apr. 3, 1998

(86) PCT No.: PCT/JP98/01538

§ 371 (c)(1),
(2), (4) Date: Sep. 15, 2000

(87) PCT Pub. No.: WO99/52033

PCT Pub. Date: Oct. 14, 1999

(51) Int. Cl.[7] ...................... G01R 31/3177; G06F 11/25
(52) U.S. Cl. .......................... 714/726; 714/727; 714/36
(58) Field of Search ................................. 714/726–731, 714/36, 38; 717/134

(56) References Cited

U.S. PATENT DOCUMENTS 6,412,081 B1 * 6/2002 Koscal et al. ................. 714/34

FOREIGN PATENT DOCUMENTS

| JP | 59-129434 | 7/1984 | | |
|---|---|---|---|---|
| JP | 2-110792 | 4/1990 | | |
| JP | 2-245681 | 10/1990 | | |
| JP | 3-105269 | 5/1991 | | |
| JP | 03105269 A | * 5/1991 | ........... | G01R/31/28 |
| JP | 3-174634 | 7/1991 | | |
| JP | 3-202924 | 9/1991 | | |
| JP | 03202924 A | * 9/1991 | ........... | G06F/11/22 |
| JP | 5-72273 | 3/1993 | | |
| JP | 6-324906 | 11/1994 | | |
| JP | 7-270494 | 10/1995 | | |
| JP | 07270494 A | * 10/1995 | ........... | G01R/31/28 |

* cited by examiner

*Primary Examiner*—R. Stephen Dildine
(74) *Attorney, Agent, or Firm*—Miles & Stockbridge P.C.

(57) ABSTRACT

A semiconductor device including a port circuit (301) connected to an internal circuit, external terminals to which the port circuit is connected and a boundary scanning circuit (180, 18), the boundary scanning circuit being the one that makes access to the external terminals through the test access terminals. The test access terminals are also used as predetermined external terminals among the external terminals. Selection means (301, 303 to 307) are provided for selectively determining whether the multi-use terminals (P1 to P5) be connected to the port circuit or to the boundary scanning circuit, and for selecting, as an initial state, the state where the multi-use terminals are connected to the boundary scanning circuit in response to the power-on reset. Since the test access terminals need not be dedicated, the boundary scanning function can be furnished while guaranteeing pin compatibility of external terminals. When the boundary scanning function is not utilized or when the port function of the multi-use terminals is not used despite of using the boundary scanning function, complete compatibility is guaranteed for the semiconductor device which is not furnished with the boundary scanning function.

18 Claims, 14 Drawing Sheets

□ : B/S CELL   ■ : BY-PASS REGISTER

FIG. 10

PORT CONTROL REGISTER

| BIT: | 15 | 14 | 13 | 12 | 11 | 10 | 9 | 8 |
|---|---|---|---|---|---|---|---|---|
| BIT NAME: | PX7MD1 | PX7MD0 | PX6MD1 | PX6MD0 | PX5MD1 | PX5MD0 | PX4MD1 | PX4MD0 |
| INITIAL VALUE: | 1/0 | 0 | 1/0 | 0 | 1/0 | 0 | 1/0 | 0 |
| R/W: | R/W | R/W | R/W | R/W | R/W | R/W | R/W | R/W |

| BIT: | 7 | 6 | 5 | 4 | 3 | 2 | 1 | 0 |
|---|---|---|---|---|---|---|---|---|
| BIT NAME: | PX3MD1 | PX3MD0 | PX2MD1 | PX2MD0 | PX1MD1 | PX1MD0 | PX0MD1 | PX0MD0 |
| INITIAL VALUE: | 1/0 | 0 | 1/0 | 0 | 1/0 | 0 | 1/0 | 0 |
| R/W: | R/W | R/W | R/W | R/W | R/W | R/W | R/W | R/W |

| BIT (2n+1) | BIT 2n | TERMINAL FUNCTION |
|---|---|---|
| PXnMD1 | PXnMD0 | |
| 0 | 0 | OTHER FUNCTIONS |
| 0 | 1 | PORT OUTPUT |
| 1 | 0 | PORT INPUT (PULL-UP MOS : ON) |
| 1 | 1 | PORT INPUT (PULL-UP MOS : OFF) |

SEMICONDUCTOR DEVICE

TECHNICAL FIELD

This invention relates to a semiconductor device of the surface mount type having a boundary scanning function. More particularly, the invention relates to an electronic circuit device in which the semiconductor device is mounted on a wiring board, such as technology that can be effectively applied to a microcomputer or a microprocessor in which the external terminals that can be surface-mounted are arranged in the form of an array on the bottom surface of a CSP (chip-size package).

BACKGROUND OF THE INVENTION

The electronic circuits (hereinafter also simply referred to as boards) in which a semiconductor device is mounted on a circuit board have heretofore been tested by inputting and outputting data by bringing a probe into contact with a wiring on a circuit board among the semiconductor devices. As the mounting becomes highly dense in recent years, however, it is becoming difficult to bring the probe into contact with the wiring among the semiconductor devices. Instead of bringing the probe into contact with the wiring of the board, therefore, there has been put into practical use the boundary scanning technology according to which the semiconductor device is provided, in advance, with a constitution which makes access to the external terminals of the semiconductor devices through test terminals of the board.

The semiconductor device corresponding to the boundary scanning has flip-flops called boundary scanning cells attached to the external terminals thereof, and is provided with boundary scan-dedicated terminals such as TDI, TDO, TCK and TMS. Every boundary scanning cell is so connected as to work as a shift register that enters through TDI and goes out from TDO. TMS and TCK are control terminals of a test logic based on the boundary scanning. On the circuit board, TDI and TDO are connected among the semiconductor devices so that the boundary scanning cells are all connected as a shift register. By supplying a common control signal to TCK and TMS of all semiconductor devices that are mounted, it is allowed to move the long shift register to make access to all pins of all chips from the external side. This makes it possible to test the wiring board that is short-circuited or is opening, as well as to test whether the input/output circuit has been broken at the time of mounting.

The boundary scanning has been internationally standardized as IEEE Std 1149.1 in February, 1990.

The present inventors have studied about imparting the above function even to microcomputers that have not so far been furnished with the boundary scanning function. That is, when the external terminals such as of BGA (ball grid array) that can be surface-mounted are arranged in the form of an array on the bottom surface of the CSP, undesired stress may act on the connection portions of the wiring of the wiring board and the on external terminals causing them to be electrically separated. This, however, cannot be confirmed since the external terminals are positioned on the back surface of the CSP. To cope with this, therefore, it has been studied to use the boundary scanning function.

With the boundary scan-dedicated terminals such as TDI, TDO, TCK and TMS being added, however, it becomes no longer possible to guarantee the compatibility with the microcomputers of before being furnished with the boundary scanning function due to the number of the external terminals and the package size.

Even when it is attempted to newly furnish the debugging function, it is not allowed to newly provide external terminals for inputting and outputting debugging information from the standpoint of guaranteeing compatibility with the microcomputers of before being furnished with the above function.

This invention provides a semiconductor device capable of being furnished with the boundary scanning function without increasing the number of the external terminals.

This invention further provides a semiconductor device capable of being furnished with the debugging function without increasing the number of the external terminals.

The invention further provides an electronic circuit capable of easily confirming the defective connection between the wiring of the wiring board and the external terminals of the semiconductor device.

The above and other objects as well as novel features of the invention will become obvious from the following description of the specification and the accompanying drawings.

DISCLOSURE OF THE INVENTION

This invention is concerned with a semiconductor device comprising an internal circuit, a port circuit connected to the internal circuit, external terminals to which the port circuit is connected, and a boundary scanning circuit, wherein the boundary scanning circuit is the one that makes access to the external terminals through test access terminals, the test access terminals are also used as predetermined external terminals among the external terminals, selection means is provided for selectively determining whether the multi-use terminals be connected to the port circuit or to the boundary scanning circuit, the selection means selecting, as an initial state, the state where the multi-use terminals are connected to the boundary scanning circuit in response to the power-on reset.

Thus, the test access terminals need not be exclusively provided and, hence, the boundary scanning function can be furnished while guaranteeing pin compatibility of external terminals. If the boundary scanning function that is furnished is not utilized or if the port function of the multi-use terminals is not utilized despite the boundary scanning function is utilized, compatibility is completely guaranteed with the semiconductor device which has not been furnished with the boundary scanning function. The state where the multi-use terminals are connected to the boundary scanning circuit due to the power-on reset, is the initial state. It is therefore allowed to reliably verify the defective electric connection between the external terminals of the semiconductor device and the wiring board by utilizing the boundary scanning function. If the initial state cannot be accomplished, it becomes necessary to really operate the internal circuit (e.g., to have a CPU execute a program) to connect the multi-use terminals to the boundary scanning circuit. Here, however, when it is attempted to verify the defective electric connection between the external terminals and the circuit board, the normal operation of the internal circuit is not guaranteed if there is a defective connection and it is not possible to verify the defective electric connection by using the boundary scanning function.

The selection means may be so constituted as to initially determine the destination to which the multi-use terminals are to be connected according an external condition (e.g., logical value of mode signal) at the time of power-on reset. By taking into consideration the case where the semiconductor device is mounted on the circuit board that does not utilize the boundary scanning function, the device can be conveniently used if the multi-use terminals are connected, as the initial state, to the port circuit.

The state selected by the selection means can be changed by the CPU included in the internal circuit in compliance with an operation program.

According to a further concrete embodiment of the invention, the selection means includes a multiplexer which enables the multi-use terminals to be connected to the boundary scanning circuit or to the port circuit, and a port control register which initially sets, in response to the power-on reset, the control data for determining the state to be selected by the multiplexer. The state is selected by the multiplexer when the power-on is reset depending upon the state of the mode signal of when the power-on is reset.

The port control register may be constituted in a manner as described below in order to eliminate the misunderstanding caused by formal inconsistency that the control value of the multiplexer by the port control resister is not in agreement with the port control register access value by the CPU when the port control register is accessible by the CPU through the internal bus. That is, the port control register is constituted by:

memory means which stores a first control data that instructs the connection of the multi-use terminals to the port circuit and a second control data that instructs the connection of the multi-use terminals to the boundary scanning circuit in synchronism with the power-on reset and in parallel; and a selection logic for determining which one of the first control data or the second control data be validated depending upon the state of the mode signal of when the power-on is reset.

When the internal circuit includes a user break control circuit for halting the instruction execution operation of the CPU, the boundary scanning circuit can be imparted with a function for supplying the break condition data input from the test access terminal to the user break control circuit. Immediately after the reset of power-on, therefore, the break condition and the like condition are set through the boundary scanning circuit, and the user program is executed by the CPU. Then, when the execution condition comes in agreement with the break condition, the user break control circuit halts the execution of the user program by the CPU.

When the internal circuit includes a debugging circuit that forms data for tracing the state of instruction executed by the CPU, the terminals for outputting the data for effecting the tracing formed by the debugging circuit to an external unit are also used as predetermined external terminals among the external terminals, and there is employed selection means for determining whether the multi-use terminals be connected to the port circuit or to the debugging circuit. Thus, the semiconductor device can be furnished with the debugging function without increasing the number of the external terminals.

In an electronic circuit in which the semiconductor device or the like is mounted on a circuit board, the circuit board includes formed thereon a first wiring to which are connected the multi-use terminals of the semiconductor device and a second wiring to which are connected the external terminals except the multi-use terminals of the semiconductor device. The external terminals are arranged in the form of an array on one surface of the package in a manner that they can be surface-mounted. Even when the external terminals are arranged like an array on the back surface of the package, the defective connection between the semiconductor device and the circuit board can be easily verified by using the boundary scanning circuit. The second wiring on the circuit board is dedicated for the boundary scanning. When the boundary scanning function is to be utilized, therefore, the multi-use terminals that also work as test access terminals on the circuit board, become no longer usable for transmitting signals to the port circuit. In this sense, it is advantageous that the external multi-use terminals that are also used as test access terminals, are imparted with a signal input/output function which is used less frequently. Quite the same holds even for the external multi-use terminals for connection to the debugging circuit.

According to another aspect of the invention giving importance to the function set to the external terminals, there is provided a semiconductor device comprising a first external terminal, a second external terminal, a first internal circuit, a second internal circuit, and a function-determining circuit for determining the function of the external terminals to couple the first external terminal to the first internal circuit in response to a signal of a first level input to the second external terminal and to couple the first external terminal to the second internal circuit in response to a signal of a second level different from the first level and is input to the second external terminal. This makes it possible to determine the function of the external terminal of the semiconductor device depending upon the state of another external terminal. The first internal circuit is, for example, that of the microprocessor that is usually used, and the second internal circuit is, for example, the test control circuit such as of the boundary scanning circuit or the debugging circuit.

The semiconductor device can further have a third external terminal to which a reset signal will be supplied. In this case, the function-determining circuit determines the function of the first external terminal in response to the reset signal fed to the third external terminal.

BRIEF DESCRIPTION OF THE DRAWINGS

FIG. 10 is a diagram of format of a port control register;

BEST MODE FOR CARRYING OUT THE INVENTION

Figure 2:
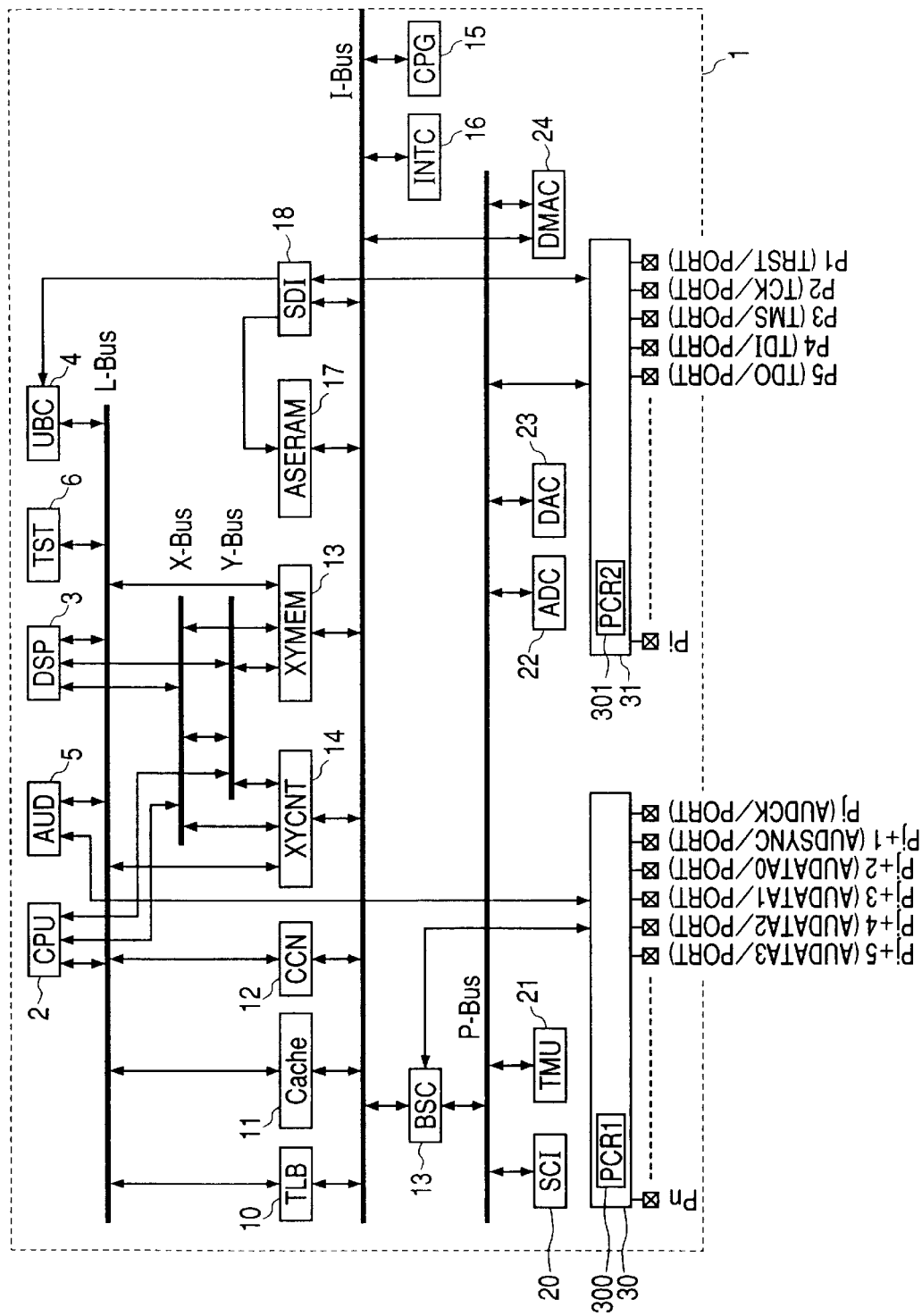
FIG. 2 is a block diagram of a microcomputer which is an embodiment of a semiconductor device of the invention.

FIG. 2 is a block diagram of a microcomputer or a microprocessor which is an embodiment of a semiconductor device according to this invention. The microcomputer (MPU) 1 shown here is formed in a semiconductor board (semiconductor chip) such as of single crystalline silicon by the widely-known semiconductor integrated circuit fabrication technology. Though there is no particular limitation, the microcomputer 1 has a local bus L-Bus, an internal bus I-Bus and a peripheral bus P-Bus. These buses are equipped with groups of signal lines for data, address and control signals.

To the local bus L-Bus are connected a central processing unit (CPU) 2, a digital signal processor (DSP) 3, a user break controller (UBC) 4, a user debugger (AUD) 5 as a debug control circuit, and a test logic (TST) 6. An address translation buffer (TLB) 10, a cache memory (Cache) 11 and a control unit (CCN) 12 therefor are arranged between the local bus L-Bus and the internal bus I-Bus. The internal bus I-Bus is connected to the peripheral bus P-Bus through a bus controller (BSC) 13. Though there is no particular limitation, to the peripheral bus P-Bus are connected a serial communication interface (SCI) 20, a timer counter (TMU) 21, an analog-digital converter circuit (ADC) 22 for converting analog signals into digital signals, a digital-analog converter circuit (DAC) 23 for converting digital signals into analog signals, and a direct memory access controller (DMAC) 24.

FIG. 2 typically illustrates two input/output port circuits 30 and 31. The input/output port circuit 30 is connected to the bus controller 13 and serves as an interface port that can be connected to external address buses and data buses. The other input/output port 31 is utilized as an external interface port for the peripheral circuits that are connected to the peripheral bus P-Bus.

Though there is no particular limitation, the CPU 2 includes an arithmetic unit as represented by a general-purpose register or arithmetic logic operation unit, a group of control registers such as program counters, and an instruction control unit for fetching the instruction and for controlling or operating the decoding and the procedure for executing the instruction. The CPU 2 fetches the instruction from the external memory, decodes the instruction using the instruction decoder, and processes the data corresponding to the instruction.

The DSP 3 is connected to an XY memory (XYMEM) 13 through dedicated buses X-Bus and Y-Bus. The XY memory 13 interfaces the internal bus I-Bus, too. A memory controller (XYCNT) 14 monitors an access requirement to the XY memory 13 from the DSP 3 and an access requirement from the side of the internal bus I-Bus, and arbitrates the access requirements. The XY memory 13 is also used as a work region of the CPU 2. The CPU 2 not only fetches the data for the DSP 3 but also fetches all instructions inclusive of a fixed-point instruction for the DSP 3.

Though there is no particular limitation, the microcomputer 1 handles virtual address space defined by a virtual address of 32 bits and physical address space defined by a physical address of 29 bits. The address translation data for translating the virtual address into the physical address includes a virtual page number and a corresponding physical page number. An address translation table is formed in an external memory that is not shown of the microcomputer 1. The external memory that is not shown is connected to the input/output port circuit 30. Among the address translation data in the address translation table, those that are used recently are stored in the address translation buffer (TLB) 10. The address translation buffer 10 stores data and address translation data for instruction and associatively retrieves, from the address translation data, a physical page number corresponding to a virtual page number of the virtual address which the CPU 2 has output to the local bus L-Bus for fetching the data or the instruction. When the result of retrieval indicates the presence of a desired address translation data (TLB is hit), the virtual address is translated into the physical address by using the address translation data. When the result of retrieval indicates the absence of a desired address translation data (TLB is missed), the desired address translation data is read out from the address translation table on the external memory. The operation of the address translation is controlled by the control unit 12.

Though not particularly diagramed, the cache memory 11 includes an associative memory unit of the four-way-set associative type. The associative memory unit is indexed by using a portion of the logic address, the physical address is held in a tag portion of the entry, the indexed tag portion is compared for its logic address with the physical address, and the cache miss/hit is determined depending upon the result of comparison.

The cache memory 11 receives the physical address that is translated through the address translation buffer 10 at the time of fetching the data or the instruction, and associatively retrieves the cache entry based thereupon as described above. When the result of retrieval indicates the read hit, the data corresponding to the physical address are output to the local bus L-Bus from the cache line related to the hit. When the result of retrieval indicates the read miss, the data of an amount of a cache line inclusive of data related to the miss are read out from the external memory through the bus controller 13 and the input/output port 30 to fill the cache. Then, the data related to the cache miss are read onto the local bus L-Bus. When the result of retrieval indicates the write hit, the data is written into the entry that is hit provided the cache operation mode is a copy back mode, and the dirty bit of the entry is set. In the write through mode, the data are written into the entry that is hit, and the data are also written into the external memory. When the result of retrieval indicates the write miss, the cache is filled provided the cache operation mode is the copy back mode, whereby the dirty bit is set to update the tag address, and the data is written onto the cache line that was filled. In the case of the write through mode, the data are written into the external memory only.

The cache fill is an operation for reading the data of cache line from the external memory that is not shown. To write the data that are read out onto the cache line, the cache entry is replaced. When there is an invalid cache entry, the invalid cache entry is replaced. When there is no invalid cache entry, the cache entry that has not been recently used is set to be an object of replacement according to the logic of LRU (least recently used). The replace control is executed by the control unit 12.

Depending upon the circuit (accessible address area) accessible by CPU 2 and DMAC 24, the bus controller 13 controls the bus cycle by inserting control the access data size, access time and wait state.

The microcomputer 1 operates in synchronism with the clock signals output from a clock pulse generator (CPG) 15. An interrupt controller (INTC) 16 executes the masking and arbitration for the interrupt request and exceptional process request from the inside and outside of the microcomputer 1.

The microcomputer 1 is not the one dedicated to the evaluation but is a so-called real chip and realizes the debugging function to some extent relying upon the user break controller 4, user debugger 5 and substitute memory (ASERAM) 17. The substitute memory 17 can be used for the user program region executed by, for example, the CPU 2.

The user break controller 4 halts the execution of the user program by the CPU 2 when the break condition such as instruction address is set, and the break condition that is established is detected as a result of monitoring. Execution of the user program is halted by using a break interruption. The break condition can be set by using a boundary control circuit 18 that will be described later.

The user debugger 5 detects the occurrence of branching in the instruction executed by the CPU 2 due to the execution of a branch instruction or interrupt by the CPU 2, forms data (branch trace data) for operating the address of branch destination and address of branch source and outputs them to an external unit. The branch trace data are output through the external terminals Pj to Pj+5. Though the details will be described later, the external terminals Pj to Pj+5 have not been dedicated as output terminals AUDCK, AUDSYNC, AUDATA0, AUDATA1, AUDATA2, AUDATA3 for the branched trace data, but are also used as port terminals PORT of the input/output port circuit 30. Which terminal function be selected is determined depending upon the state of setting the port control register (PCR1) 300. The user debugger 5 can be regarded as a test control circuit.

The microcomputer has a boundary scanning function. A boundary scanning circuit for realizing this function has boundary scanning cells and a boundary scan control circuit (SDI) 18 arranged being corresponded to predetermined terminals among the external terminals P0 to Pn connected to the input/output port circuits 30 and 31. The boundary scan control circuit 18 is regarded to be a test control circuit. Though there is no particular limitation, the terminals that are not provided with boundary scanning cells are clock input terminals, test access terminals for controlling the boundary scanning and power-on reset terminals. Though not shown in FIG. 2, the boundary scanning cells are, in practice, included in the input/output port circuits 30 and 31. Symbols P1 to P5 denote external terminals for control used for the boundary scanning. The terminals P1 to P5 are not dedicated as the terminals TRST, TCK, TMS, TDI, TDO for boundary scanning, but are also used as port terminals PORT of the input/output port circuit 31. Which terminal function be selected is determined depending upon the state of setting the port control register (PCR2) 301.

Figure 3:
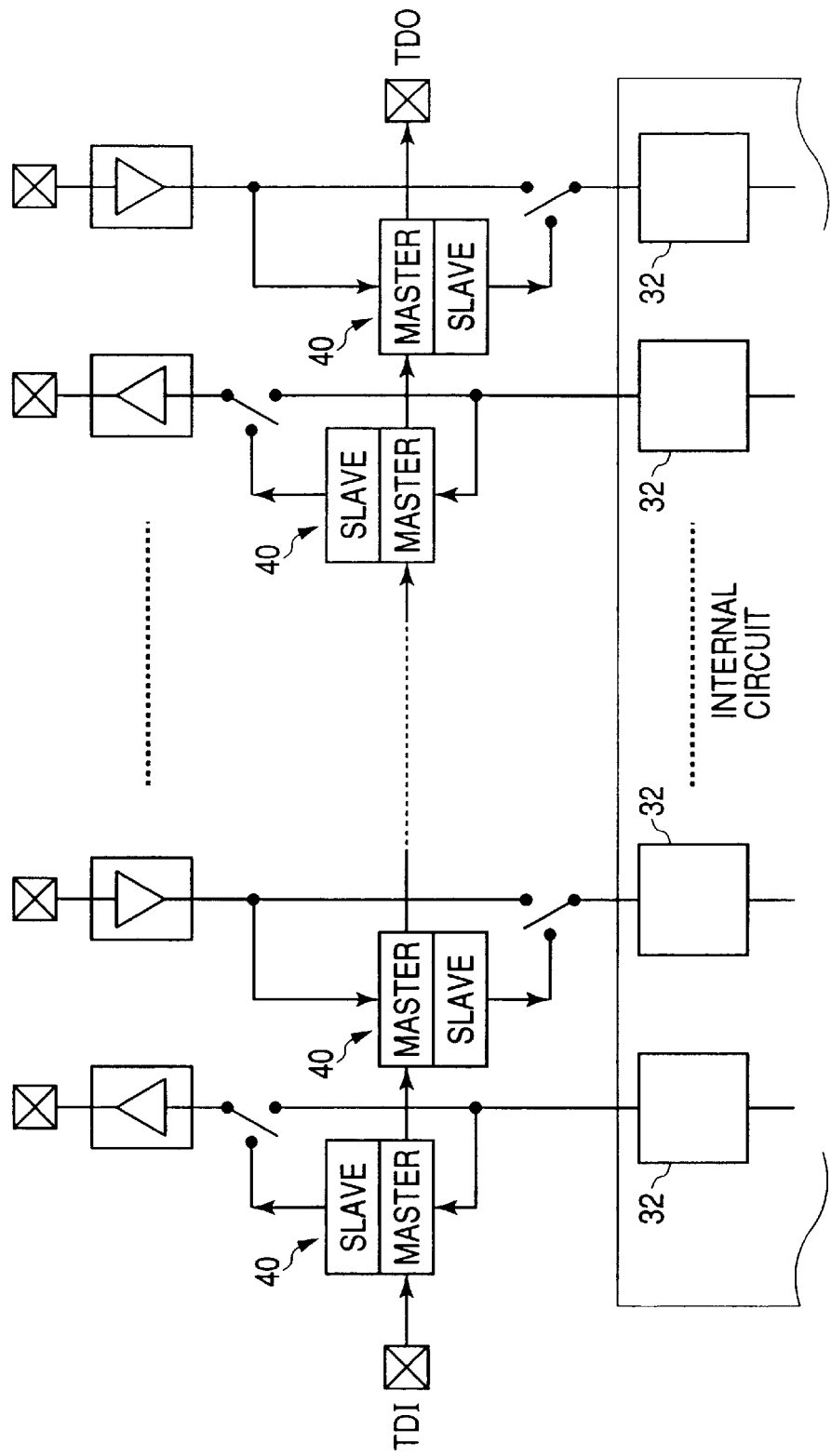
FIG. 3 is a diagram schematically illustrating boundary scanning cells.

FIG. 3 schematically illustrates the boundary scanning cells. The boundary scanning cells 40 have a master/slave constitution and are attached to the external terminals. The boundary scanning cells 40 are such that the master stages are successively connected in series to constitute a boundary scanning register that works as a shift register. The input of the boundary scanning register is connected to the terminal TDI, and the output terminal of the boundary scanning register is connected to TDO. The master stages of the boundary scanning cells 40 execute the shift operation, and receive data from the external terminals or from the internal circuits. The slave stages send data to the external terminals or to the internal circuits. The operation of the master stages and of the slave stages are controlled by the boundary scan control circuit (SDI) 18. When the boundary scanning operation mode has not been set, the external terminals are connected through to the internal circuits, and the boundary scanning cells do not work. FIG. 3 representatively shows port registers 32 as internal circuits.

Figure 4:
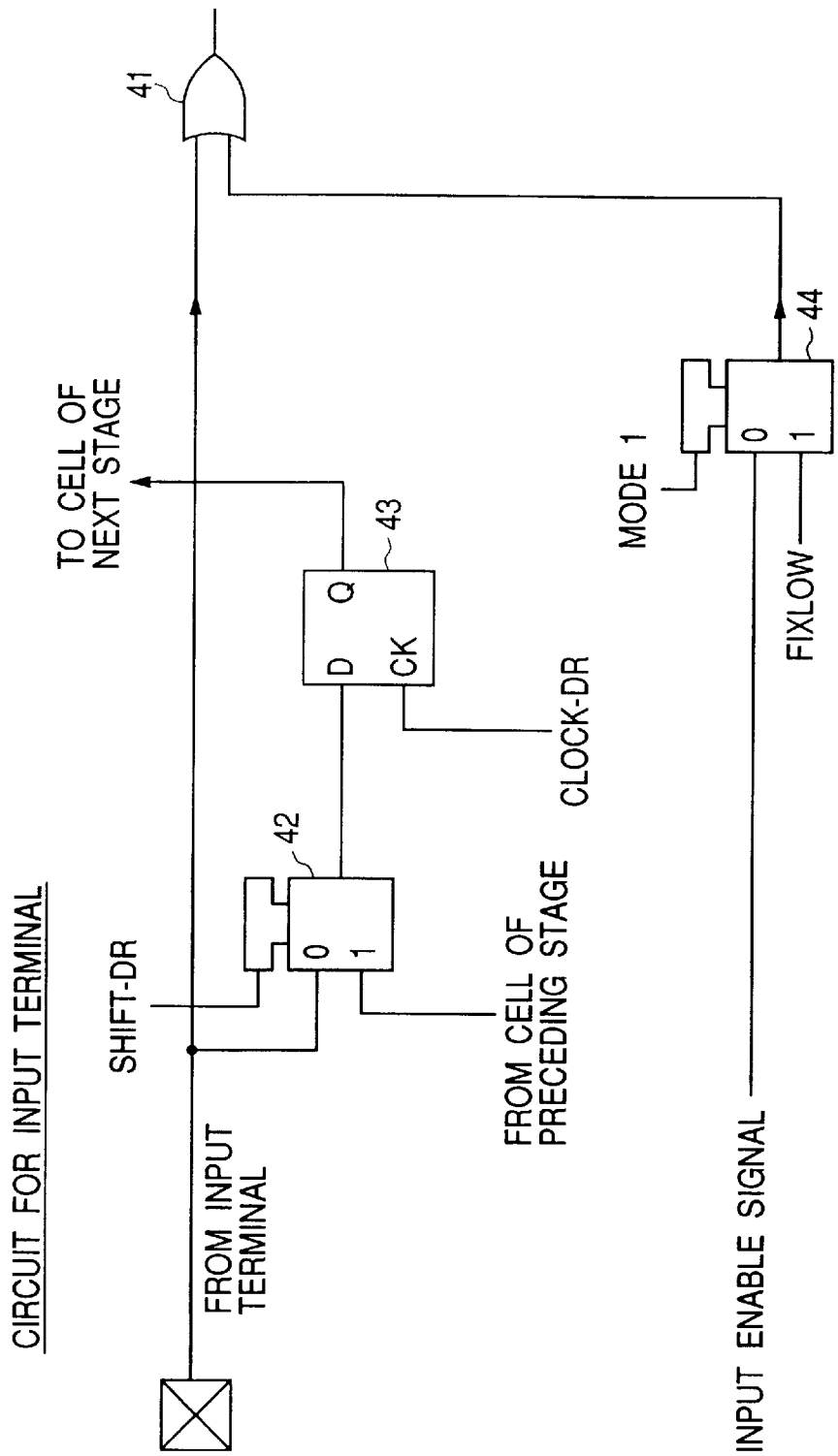
FIG. 4 is a diagram of a logic circuit illustrating, in detail, the boundary scanning cell provided to correspond to an input terminal.

FIG. 4 illustrates in detail the boundary scanning cell provided for an input terminal. An input buffer is represented by an OR gate 41. A multiplexer 42 selects a signal from the input terminal or selects an output of the boundary scanning cell of the preceding stage, and sends it to a latch circuit 43. When the boundary scanning register is instructed to execute the shifting operation, an input from the cell of the preceding stage is selected by a signal SHIFT-DR. The output of the latch circuit 43 is connected to the boundary scanning cell of the next stage. The latching operation of the latch circuit 43 is controlled by a clock signal CLOCK-DR. An input enable signal is applied to the OR gate 41 through a multiplexer 44. The multiplexer 44 is selectively controlled by a control signal MODE1 depending upon the kind of the boundary scanning operation. When the boundary scanning register executes the shifting operation, for example, a low level fix signal FIXLOW is selected to inhibit the input operation of the OR gate 41.

Figure 5:
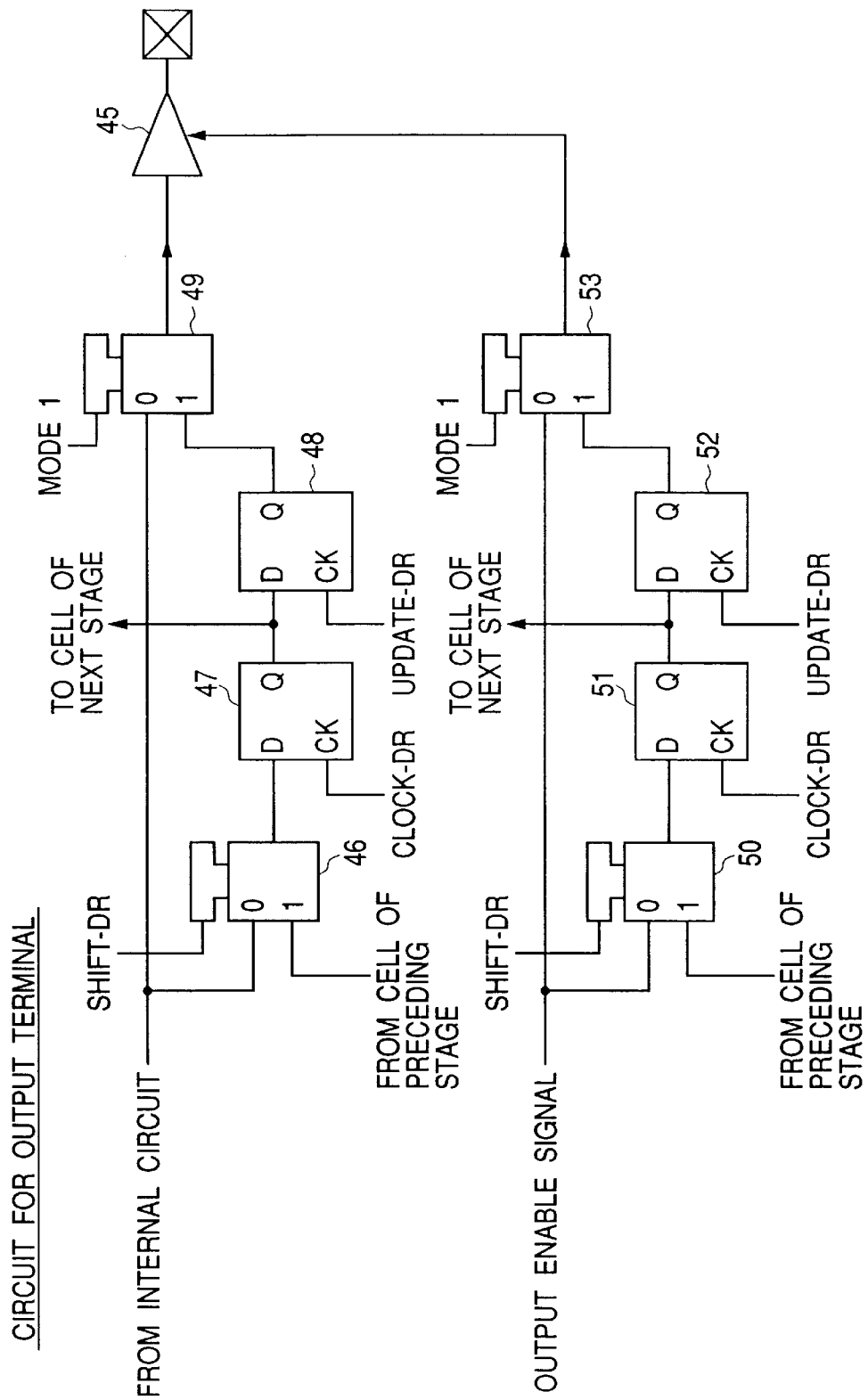
FIG. 5 is a diagram of a logic circuit illustrating, in detail, the boundary scanning cell provided to correspond to an output terminal.

FIG. 5 illustrates in detail a boundary scanning cell provided to correspond to the output terminal, and wherein reference numeral 45 denotes a tristate output buffer. A multiplexer 46 selects a signal from the internal circuit or an output of the cell of the preceding stage, and supplies it to a master latch circuit 47. When the boundary scanning register is instructed to execute the shifting operation, the input from the cell of the preceding stage is selected by the signal SHIFT-DR. The output of the master latch circuit 47 is connected to the boundary scanning cell of the next stage and to a slave latch circuit 48. The latching operation of the master latch circuit 47 is controlled by the clock signal CLOCK-DR, and the latching operation of the slave latch circuit 48 is controlled by the clock signal UPDATE-DR. The output of the slave latch circuit 48 or the signal from the internal circuit is selected by a multiplexer 49, and is fed to the tristate buffer 45. The multiplexer 49 is selectively controlled by a control signal MODE1 depending upon the kind of the boundary scanning operation.

A multiplexer 50, a master latch circuit 51, a slave latch circuit 52 and a multiplexer 53 are provided even for the output enable signal of the tristate buffer 45 in the same manner as described earlier.

Figure 6:
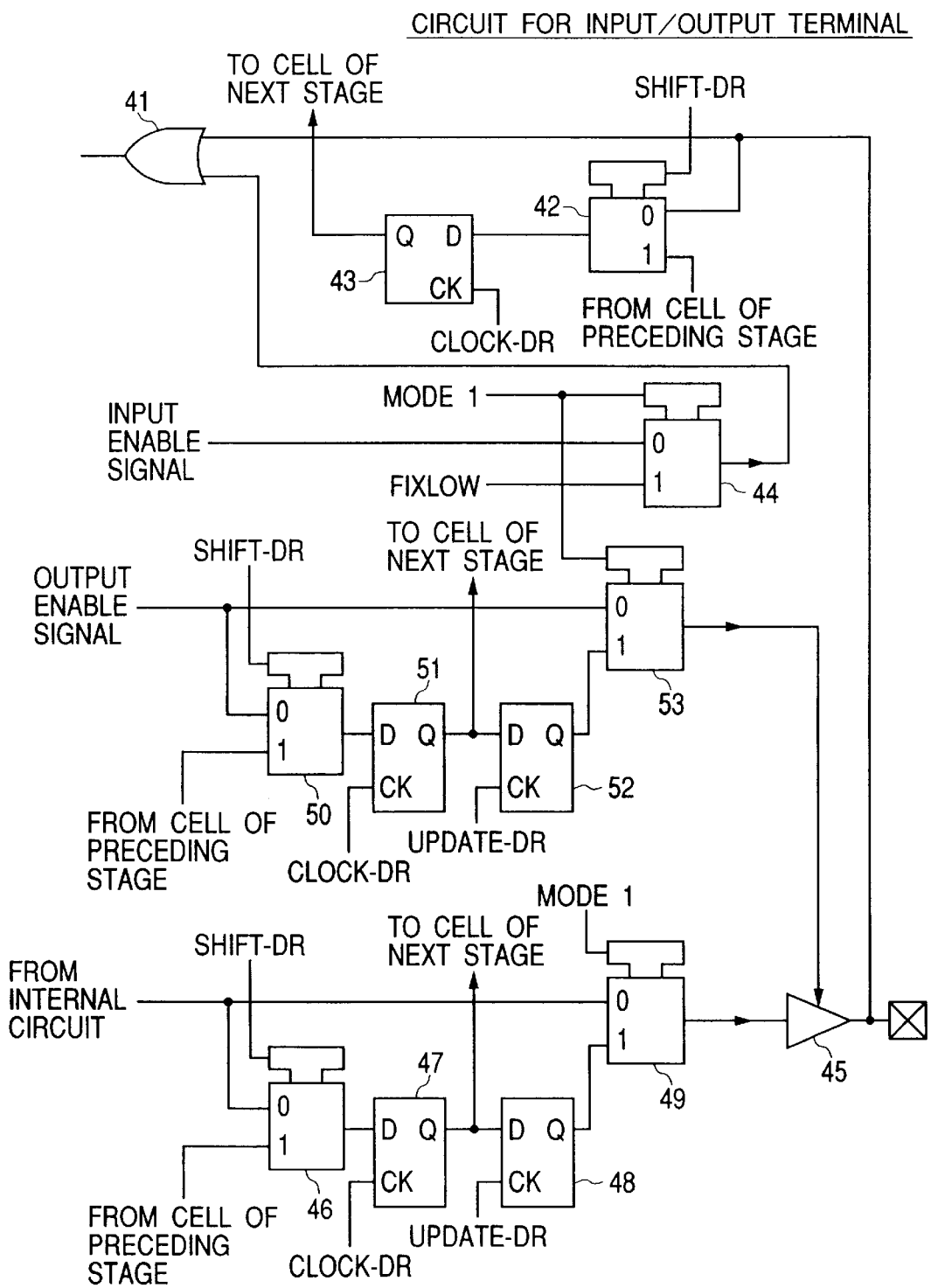
FIG. 6 is a diagram of a logic circuit illustrating, in detail, the boundary scanning cell provided to correspond to an input/output terminal.

FIG. 6 illustrates in detail the boundary scanning cell provided for the input/output terminal. The constitution shown in FIG. 6 is a combination of the constitutions of FIGS. 4 and 5, and its details are not described here.

Figure 1:
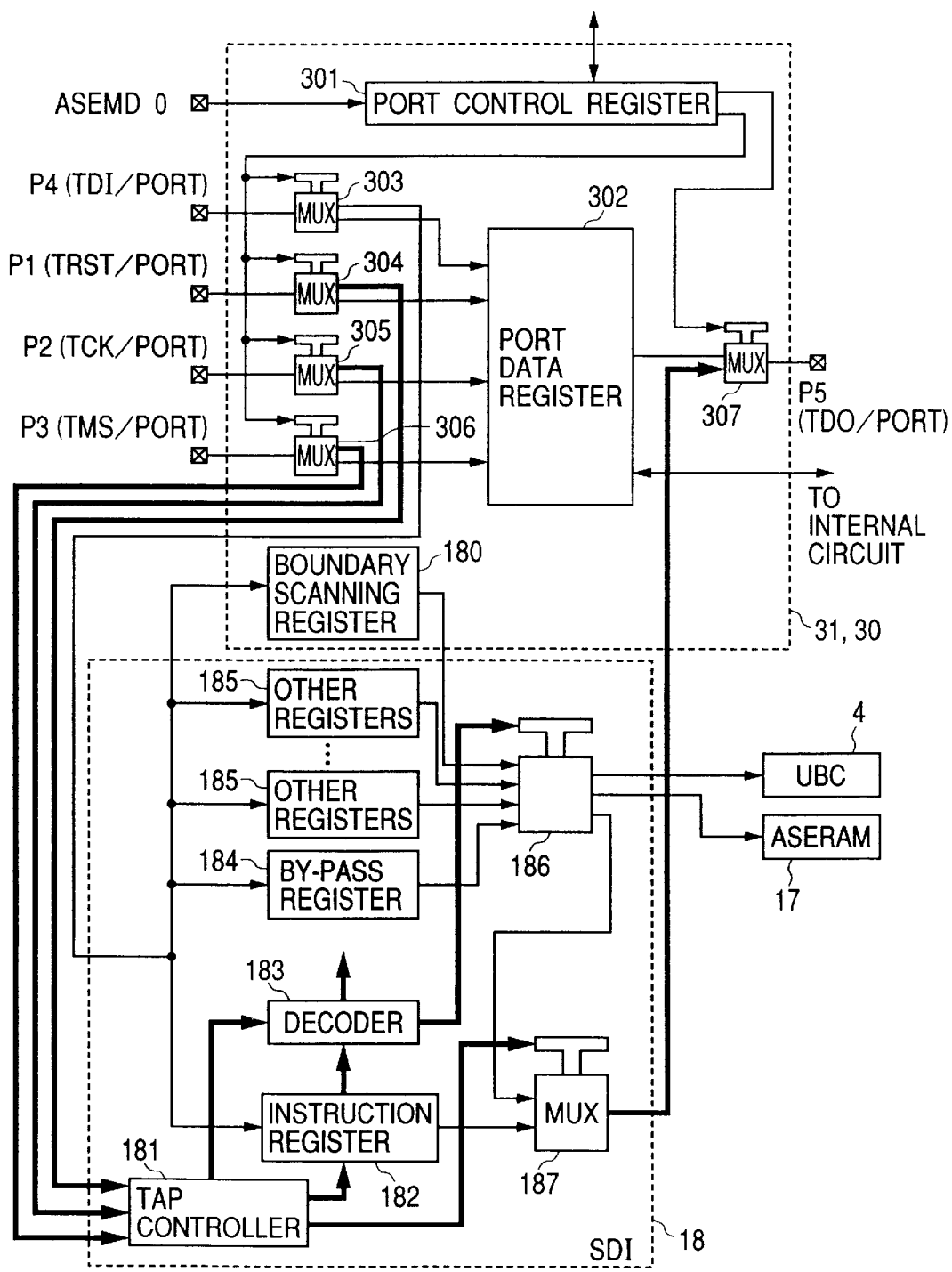
FIG. 1 is a block diagram illustrating a boundary scanning circuit in detail.

FIG. 1 illustrates the boundary scanning circuit in detail, wherein the boundary scanning register constituted by connecting the boundary scanning cells 40 in series is designated at 180. The boundary scanning register 180 is included in the input/output port circuits 30 and 31 as described earlier. FIG. 1 representatively illustrates the multi-use terminals P1 to P5 and the mode terminal ASEMD0 as external terminals corresponding to the input/output port circuit 31. The multi-use terminals P1 to P5 are selectively connected to the port data register 302 and to the boundary scan control circuit 18 via multiplexers 303 to 307. A port data register 302 constitutes a data latch for input/output that is usually provided for the input/output port circuit 31. The selection of the multiplexers 303 to 307 is determined by the state of the port control register 301. That is, the port control registers 300 and 301 are regarded to be a function-determining circuit for determining the function of the external terminals. The port data register 302 and the port control register 301 are connected to a predetermined internal circuit. Here, however, the internal circuit is not diagramed.

The boundary scan control circuit 18 includes a test access controller (TAP controller) 181, an instruction register 182, a decoder 131, a by-pass register 184, other registers 185, a selector 186 and a multiplexer 187. The boundary scanning register 180, by-pass register 184 and other registers 185 are generally referred to as data registers in contrast with the instruction register 182. In this embodiment, the boundary scan test terminals include five terminals TRS, TCK, TMS, TDI and TDO. The terminals TDI and TDO are interface terminals of the register and are used for the external unit during the boundary scanning, the terminal TCK is a terminal for the synchronized clocks in the test operation, and TMS is a control signal for changing the state in synchronism with TCK. The terminal TRST is a reset terminal of the boundary scan control circuit 18.

The TAP controller 181 is a state machine which receives input signals from the terminals TRST, TCK and TMS, and changes its control state depending upon whether TMS is "0" or "1" in synchronism with TCK. The status formed by the TAP controller 181 is supplied to the decoder 183. The instruction register 182 is loaded, through the terminal TDI, with an instruction for determining the kind of the test mode. The test mode of the boundary scan control circuit 18 is determined as the decoder 183 decodes the instruction. The TAP controller 181 is initialized when it is reset by the terminal TRST or is reset for its power-on, selects either the instruction register 182 or the data register depending upon the value of TMS, so that the instruction register is loaded with an instruction or the data register is loaded with data. Which register be selected in the data register or which one of the selector 186 or the multiplexer 187 be selected is determined depending upon the decoded result of the instruction. The test operation according to the selected operation mode changes depending upon the status of the state machine. For example, the number of times of shift of the shifting operation for the selected data register is controlled depending upon a change in the terminal TMS in synchronism with TCK.

Figure 7:
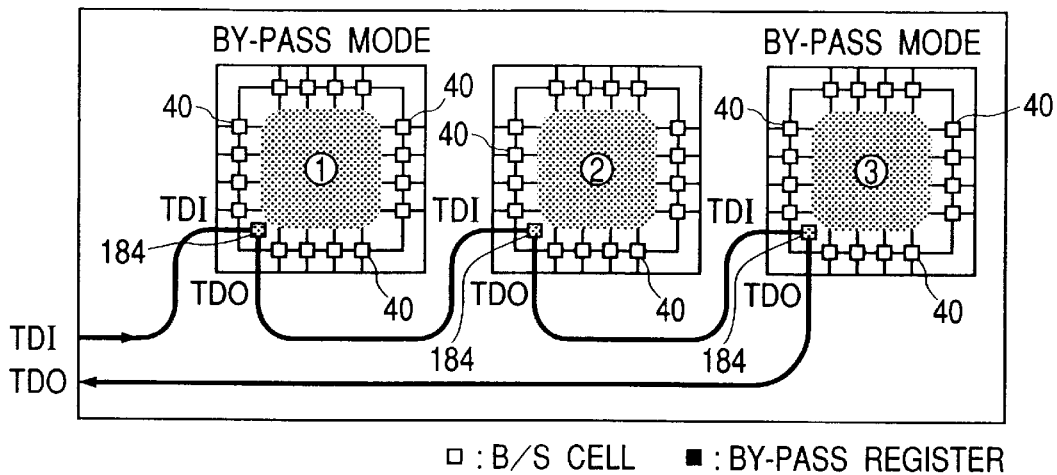
FIG. 7 is a diagram illustrating a by-pass mode.

When the by-pass mode is set by the instruction, the input terminal TDI is directly connected to the output terminal TDO from the by-pass register 184 without passing through the boundary scanning register 180 which is constituted as the shift register. The semiconductor devices having the boundary scanning function are such that the boundary scanning registers 180 are all connected like a single register on the circuit board. When it is desired to access the one boundary scanning register in only one semiconductor device, the by-pass mode is set for other semiconductor devices. Referring, for example, to FIG. 7 where three semiconductor devices are connected as a chain of boundary scanning, it may be desired to test the operation of the middle semiconductor device only by the boundary scanning. In this case, the by-pass mode may be set for the semiconductor devices of both sides.

Figure 8:
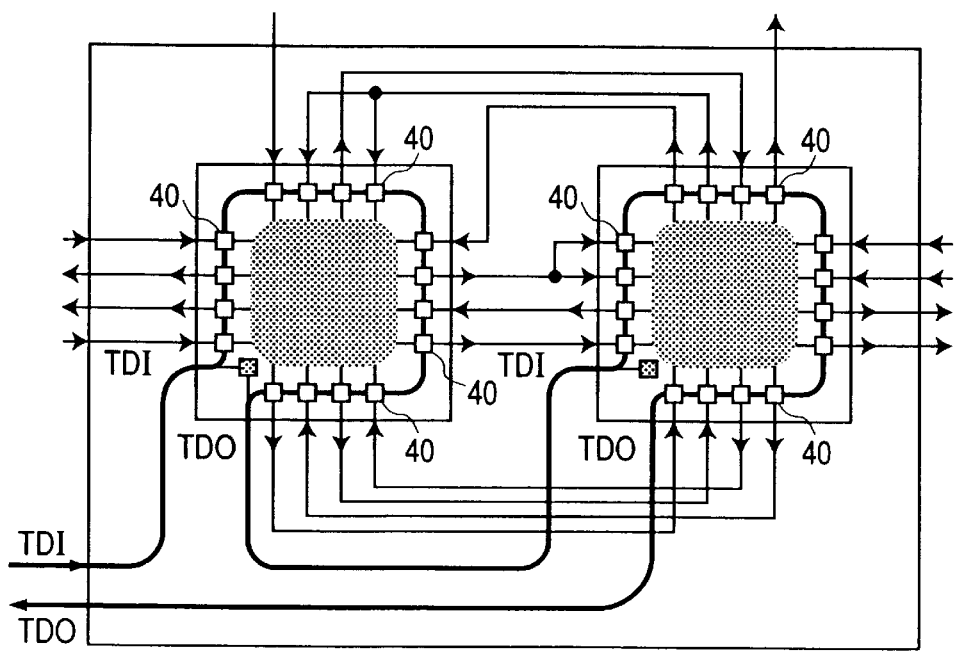
FIG. 8 is a diagram illustrating a mode for testing the wiring among the chips.

When the interchip wiring test is set by the instruction, the interior of the chip is cut off from the external terminals of the chip by the boundary scan register 180, whereby the data are output to the outer side of the chip through the boundary scanning cells corresponding to the external output terminals, and the signals are received from the outside of the chip through the boundary scanning cells corresponding to the external input terminals, in order to test the inter-chip wiring and the input/output port circuits. After the inter-chip wiring test mode is set, the test sequence is repeated by using the boundary scanning register 180. That is, the master stage of the boundary scanning cell at the external output terminal is loaded with test data from the terminal TDI in response to Shift-DR, the test data is then transferred to the slave stage in response to Update-DR and is output from the external output terminal. Further, the signal is received through the boundary scanning cell corresponding to the external input terminal, the received signal is shifted-out to the terminal TDO through the boundary scanning register 180 and, then, the next test data is shifted-in to the boundary scanning register 180 from the terminal TDI. Upon repeating this operation, the state of the interchip wiring can be evaluated for the flow of data as shown in FIG. 8.

When the operation for loading the user break controller 4 with data is set by the instruction that is loaded onto the instruction register 182, the user break condition shifted-in from the terminal TDI is input to other register 185 as shown in FIG. 1, and the break condition of the register 185 is fed to the user break controller 4 through the selector 186.

When the operation for transferring the program to the substitute memory 17 is set by the instruction loaded onto the instruction register 182, the user program shifted-in from the terminal TDI is input to other register 185 as shown in FIG. 1, and the user program in the register 185 is supplied to the substitute memory 17 through the selector 186.

Figure 9:
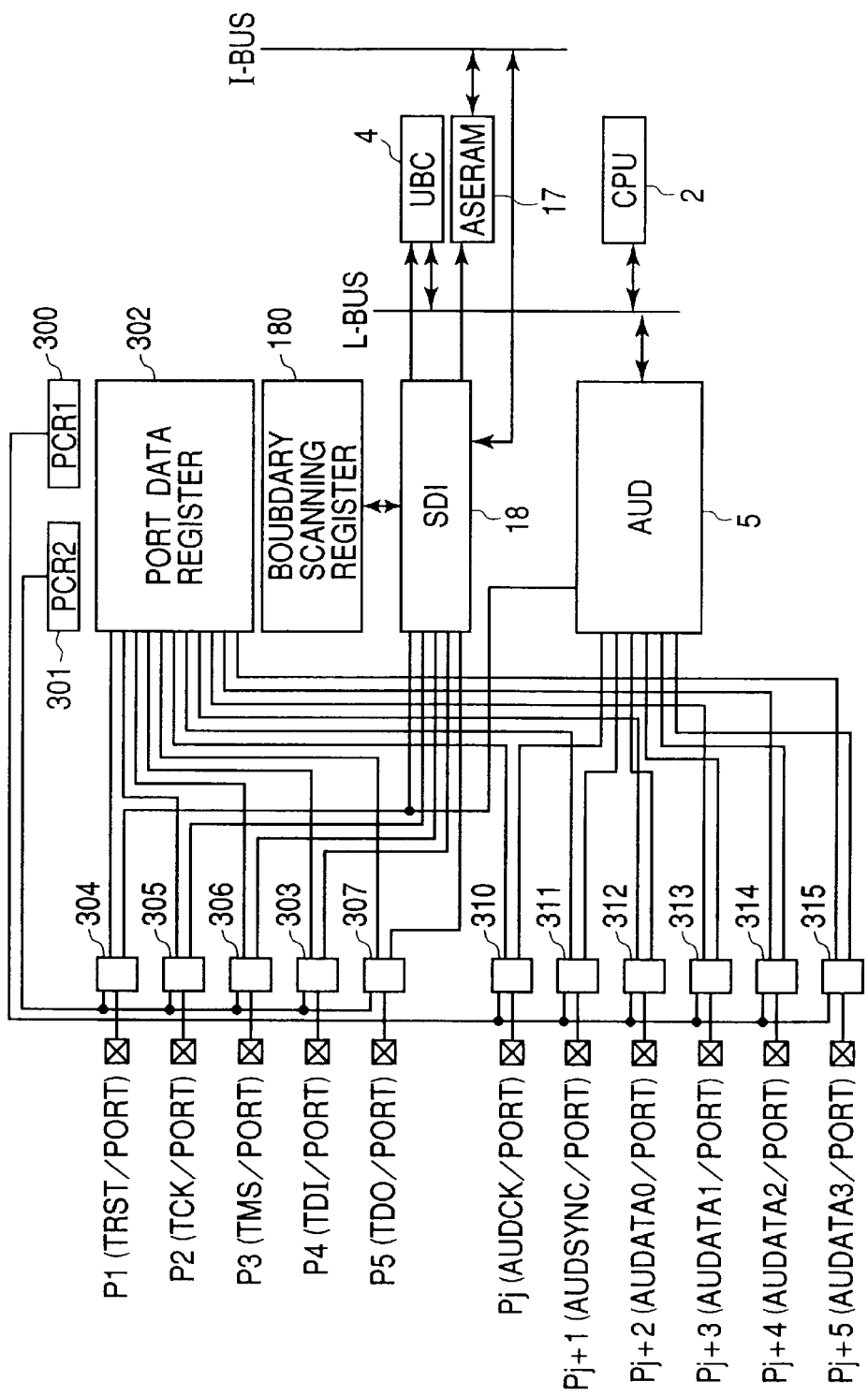
FIG. 9 is a block diagram illustrating the whole constitution of multiplex control for the multi-use terminals that are also used for the boundary scanning and debugging.

FIG. 9 illustrates the whole constitution of multiplex control for the terminals that are also used for the boundary scanning and debugging. The functions of the multi-use external terminals P1 to P5 are selected by the multiplexers 304 to 307 depending upon the state of the port control register 301. Similarly, the functions of the muti-use external terminals Pj to Pj+5 are selected by the multiplexers 310 to 315 depending upon the state of the port control register 300.

The port control registers 300 and 301 are initialized to a predetermined state at the time of power-on reset. The data can be read out from and written into the registers 300 and 301 by the CPU 2. The port control registers 300 and 301 are accessible by the CPU 2 through the internal buses P-Bus, I-Bus and L-Bus. The user debugger 5 can be separately reset through the reset terminal TRST when the function of the terminal TRST is selected, independently of power-on reset.

FIG. 10 illustrates an example of the port control registers 300 and 301. The port control registers shown in FIG. 10 determine the function of the external terminals using two bits as a unit. For example, the function of the external terminals is determined by the combination of logical values of the two bits PXnMD1 and PXnMD0 shown in FIG. 11. When, for example, PXnMD1=0 and PXnMD0="0" (other function is selected), the function is so selected that the terminals P1 to P5 work as test access terminals TRST, TCK, TMS, TDI, TDO for boundary scanning. When PXnMD1 and PXnMD0 are not 0, respectively, the function is so selected that the terminals P1 to P5 work as the port terminals PORT.

Figures 11, 12:
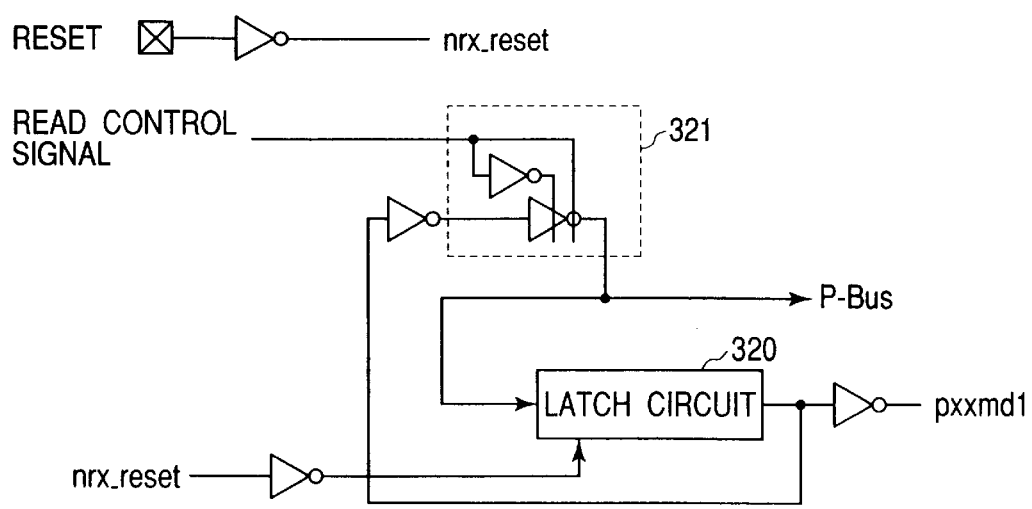
FIG. 11 is a diagram illustrating a mode of initially setting the terminal function using two bits of the control register.
FIG. 12 is a diagram of a logic circuit which is a first example of the port control register of 1-bit constitution.

FIG. 12 illustrates the constitution of a bit as an example of the port control registers 300 and 301. In FIG. 12, RESET is a power-on reset signal which is an external signal and nrx_reset is an internal signal thereof. Reference numeral 320 denotes a latch circuit of one bit of the port control registers 300 and 301, e.g., a selection control bit for the multiplexers 303 to 307. The data input terminal of the latch circuit 320 is coupled to a data signal line of one bit of the peripheral bus P-Bus, and the data output terminal of the latch circuit 320 outputs a selection control signal pxxmd1 to the multiplexer 303 through an inverter. The logical value of the signal pxxmd1 corresponds to the logical value of the bits PXnMD1 and PXnMD0 of FIG. 11. Further, the output of the latch circuit 320 is transmitted to the data signal line of one bit of the peripheral bus P-Bus via the output gate 321. Upon power-on reset, the latch circuit 320 latches the logical value "1" (high level), whereby the multiplexers 303 to 307 connect the terminals P1 to P5 to the boundary scan control circuit 18 to so select the function that the terminals P1 to P5 work as the access control terminals TRST, TCK, TMS, TDI and TDO.

As for the terminals Pj to Pj+5 that are also used for debugging, the function must be so selected that they are used for debugging when the power-on is reset. The debugging function is carried out on-board by having the CPU 2 execute the instruction. However, since the routine for initializing the CPU is different from the normal routine, it is requested to so constitute that the function is selected to also use the terminals Pj to Pj+5 for debugging upon the power-on reset even for the port control register 300 like the terminals for boundary scanning.

Figure 13:
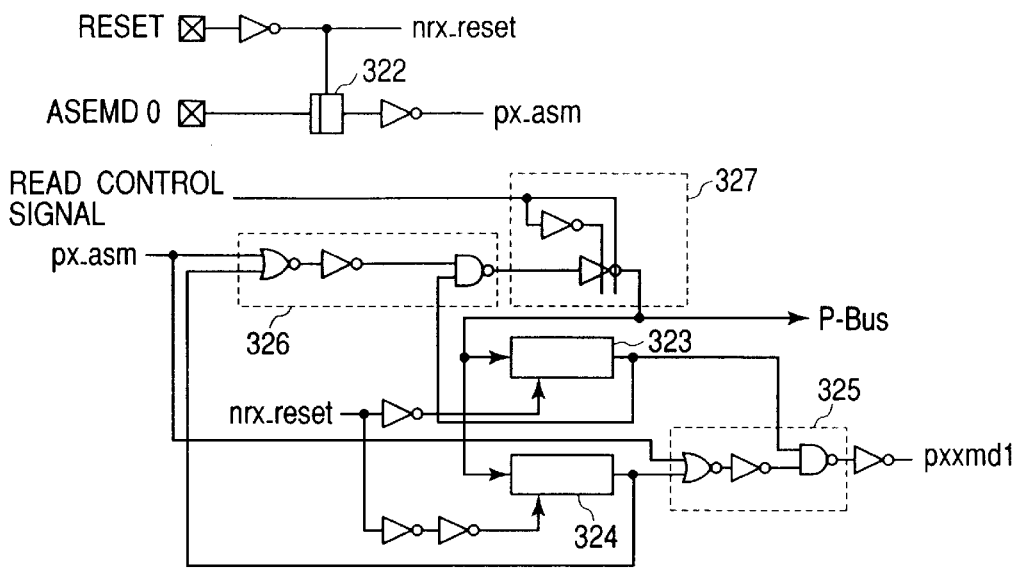
FIG. 13 is a diagram of a logic circuit which is a second example of the port control register of 1-bit constitution.

FIG. 13 illustrates a constitution for variably determining the destination to where the multi-use terminal is initially connected when the power-on is reset depending upon the external condition of when the power-on is reset, e.g., depending upon the logical value of the mode signal ASEMOD0. FIG. 13 illustrates the constitution of one-bit PXnMD1 shown in FIG. 11. PXnMD0 may be the same as that of FIG. 12.

In FIG. 13, RESET is a power-on reset signal which is an external signal, and nrx_reset is an internal signal thereof. ASEMD0 is a mode signal which is an external signal. Reference numeral 322 is a latch circuit which executes the latching operation when the power-on reset signal RESET is asserted to be logical value "0". Therefore, the signal px_asm assumes the logical value "1" for the first time when both the power-on reset signal RESET and the mode signal ASEMD0 are asserted to be logical value "0". Reference numerals 323 and 324 denote latch circuits of one bit corresponding to the bit PXnMD1, e.g., selection control bits for the multiplexers 303 to 307. Due to the internal signal nrx_reset that assumes the logical value "1" when the power-on is reset, the latch circuit 323 latches the logical value "1" (high level) and the latch circuit 324 latches the logical value "0" (low level). The selection logic 325 that receives the outputs of the latch circuits 323, 324 selects the logical value "1" or "0" depending upon the logical value of the signal px_asm. The output of the selection logic 325 is inverted through an inverter to form a selection control signal pxxmd1 for the multiplexers 303 to 307. The logical value of the signal pxxmd1 is corresponded to the logical value of the bit PXnMD1 of FIG. 11. That is, at the time when the power-on is reset, PXnMD1 (=pxxmd1) assumes the logical value "0" provided the signal ASEMD0 has the logical value "0", and the function of the test access terminals is initially set to the terminals P1 to P5. When the signal ASEMD0 has the logical value "1", on the other hand, PXnMD1 (=pxxmd1) assumes the logical value "1", and the function of the port terminals is initially set to the terminals P1 to P5. The data input terminals of the latch circuits 323 and 324 are coupled to the one-bit data signal line of the peripheral bus P-Bus, and the selection logic 326 similar to the one described above is imparted to the data outputs of the latch circuits 323, 324, too. The selection logic 326 selects either the logical value "1" or "0" depending upon the logical value of the signal px_asm. The output of the selection logic 326 is assigned to the signal line of the peripheral bus P-Bus via an inverted output gate 327. The signal thus given to the signal line is in match with the logical value of the signal pxxmd1.

The constitution of FIG. 13 can be employed for the port control register 301 even in connection with the function set to the multi-use terminals Pj to Pj+5 that are also used for debugging.

Figure 14:
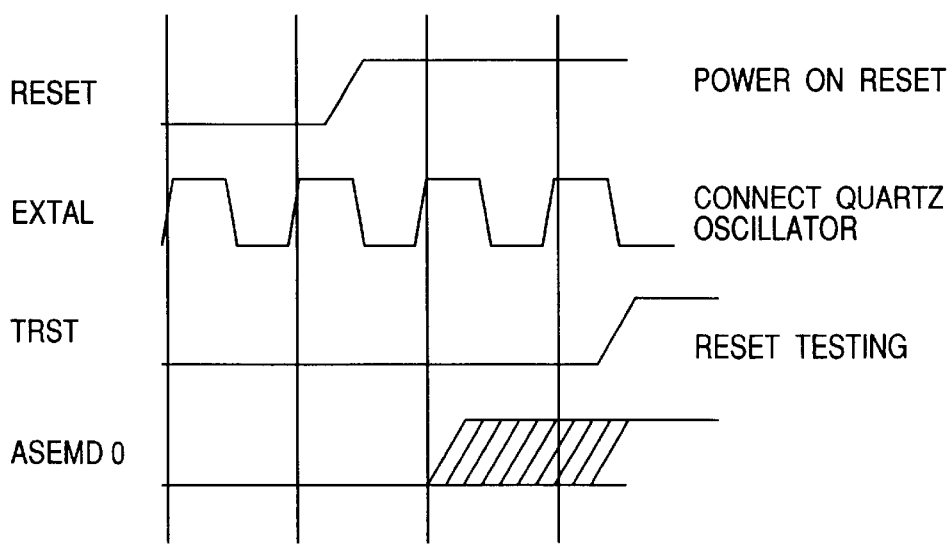
FIG. 14 is a timing chart illustrating a procedure for starting the boundary scanning of when the constitution of FIG. 13 is employed.

FIG. 14 illustrates a procedure before starting the boundary scanning when the constitution of FIG. 13 is employed. The signal ASEMD0 is asserted simultaneously with the power-on reset by the signal RESET to select the function of the test access terminals TDI, TDO, TRST, TMS, TCK. Thereafter, the boundary scan control circuit 18 is reset through the reset terminal TRST to execute the boundary scanning. As described earlier, the microcomputer 1 includes external terminals that are not boundary scanned, which are the terminals essential for controlling the boundary scanning operation, such as clock terminal, test access terminal for boundary scan control and reset terminal RESET.

Figure 15:
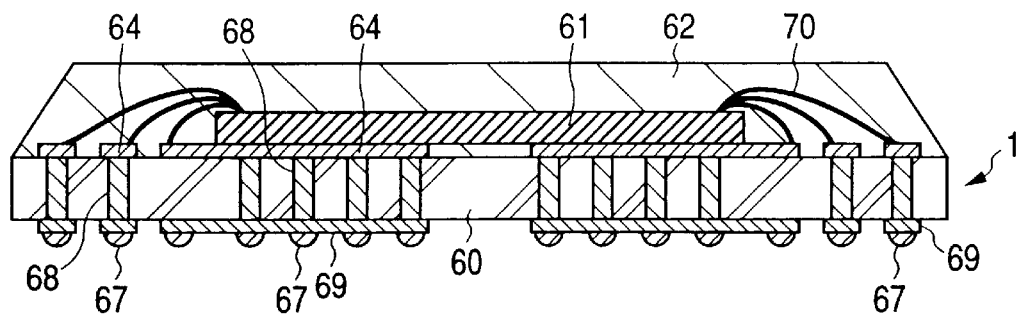
FIG. 15 is a vertical sectional view illustrating a structure packaging the microcomputer of FIG. 2.

FIG. 15 illustrates the structure of a package of the microcomputer 1 of FIG. 2. The structure shown here is a CSP structure having external terminals of the BGA type, which is surface-mounted on the circuit board.

Figure 16:
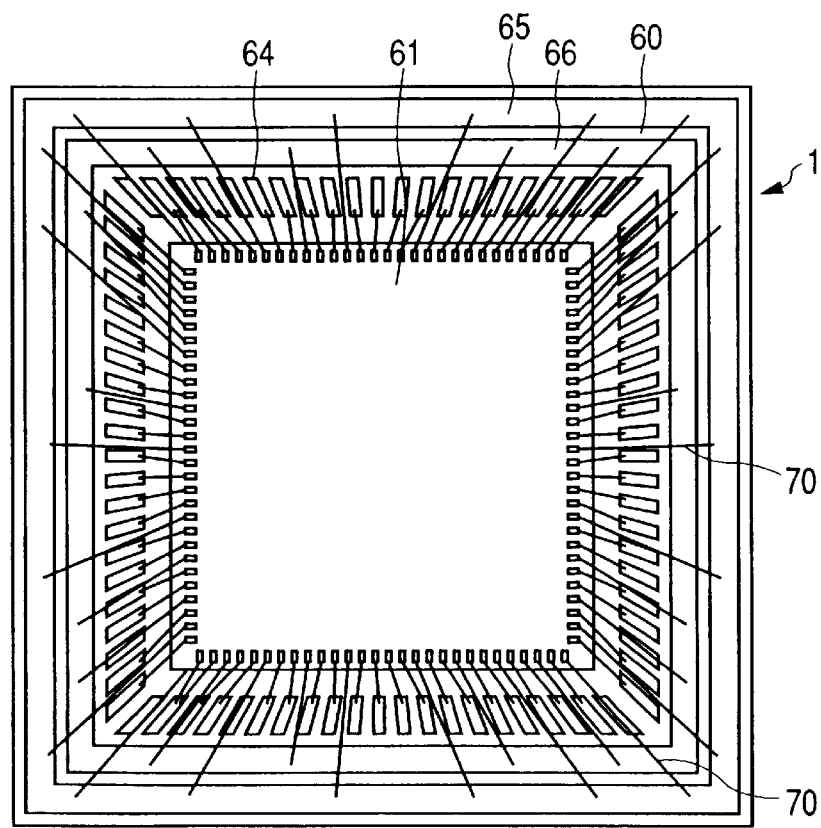
FIG. 16 is a plan view of the microcomputer of FIG. 15 but without being molded with a resin.
Figure 17:
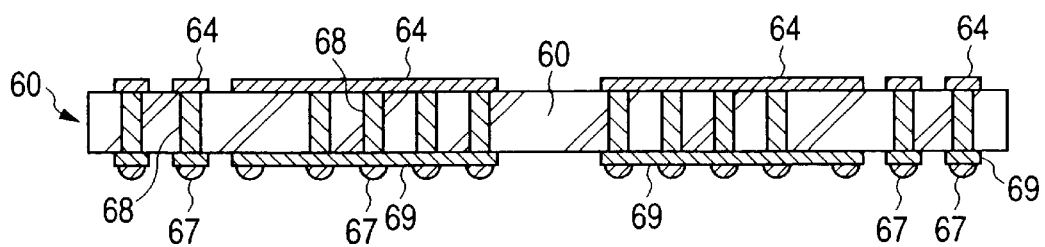
FIG. 17 is a vertical sectional view of a base board.
Figure 18:
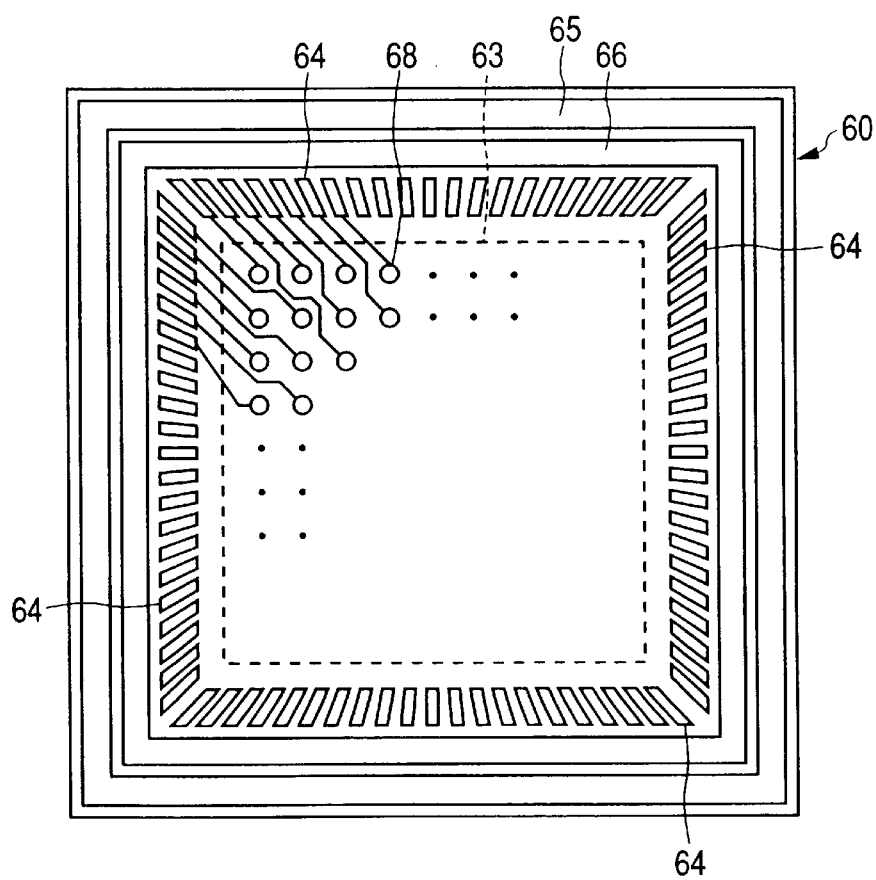
FIG. 18 is a plan view of the base board.

In the microcomputer 1 which is a semiconductor device, a microcomputer chip 61 is mounted on a base board 60 and is bonded thereto with its surface being covered with a resin sealing member 62. FIG. 16 is a plan view of the microcomputer 1 of FIG. 15 without the resin sealing member 62. As shown in a side sectional view of FIG. 17 and a plan view of FIG. 18, the base board 60 has a region 63 for mounting the microcomputer chip 61 at a central portion on the surface thereof, has many electrodes 64 arranged along the periphery thereof so that electrode pads of the microcomputer chip 61 can be boned thereto, and further has peripheral wirings 65, 66 such as power source wiring, etc. along the outer edges thereof. External terminals 67 which is the general term of the external terminals P1 to Pn are arranged in many number like an array on the back surface of the base board 60, the external terminals 67, electrodes 64 and peripheral wirings 65, 66 being connected to each other via through holes 68 and wiring 69 on the back surface. In the example of FIG. 15, the electrodes 64 are wire-bonded to electrode pads of the microcomputer chip 61. Reference numeral 70 denotes bonding wires.

In the microcomputer 1 having the boundary scanning function as described above, the test access terminals TRST, TCK, TMS, TDI and TDO are not exclusively used for their purpose only, making it possible to furnish the microcomputer with the boundary scanning function while guaranteeing compatibility of external terminals. When the boundary scanning function that is furnished is not utilized or when the port function of the multi-use terminals is not used despite of using the boundary scanning function, then, a perfect compatibility is guaranteed for the microcomputer of the same kind of before being furnished with the boundary scanning function as far as the external terminals are concerned.

Upon the power-on reset, the multi-use terminals P1 to P5 are initialized so as to be connected to the boundary scanning circuit, making it possible to reliably verify defective electric connection between the external terminals of the microcomputer 1 and the wiring board by using the boundary scanning function. When such an initial state cannot be obtained, the internal circuits must be really operated (e.g., program must be executed by the CPU) to connect the multi-use terminals to the boundary scanning circuit. In verifying defective electric connection between the external terminals and the circuit board, however, any defective connection makes it difficult to guarantee normal operation of the internal circuits, and the checking of defective electric connection itself becomes impossible relying upon the boundary scanning function.

Since the destinations of connection of the multi-use terminals P1 to P5 are initially determined depending upon the external condition (e.g., logical value of the mode signal ASEMD0) at the time of power-on reset, it is allowed to select, as an initial state, the state where the multi-use terminals P1 to P5 are connected to the port circuit. Namely, the device becomes easy to use by taking into consideration the fact that the microcomputer 1 is mounted on the circuit board which does not utilize the boundary scanning function.

When the port control register is accessible by the CPU through the internal bus, employment of the constitution of FIG. 13 makes it possible to eliminate misunderstanding caused by formal inconsistency, i.e., disagreement between the control values of the multiplexers 303 to 307 by the port control register 301 and the access values of the port control register 301 by the CPU 2.

The boundary scanning circuit is furnished with a function for shifting the break condition data input through the test access terminals into the user break controller 4, the substitute RAM 17 is furnished with a function for shifting-in the user program and, besides, the terminals for outputting the branch trace data formed by the user debugger 5 to an external unit are also used as the multi-use terminals Pj to Pj+5, thereby to furnish the microcomputer 1 with the debugging function without increasing the number of the external terminals.

Figure 19:
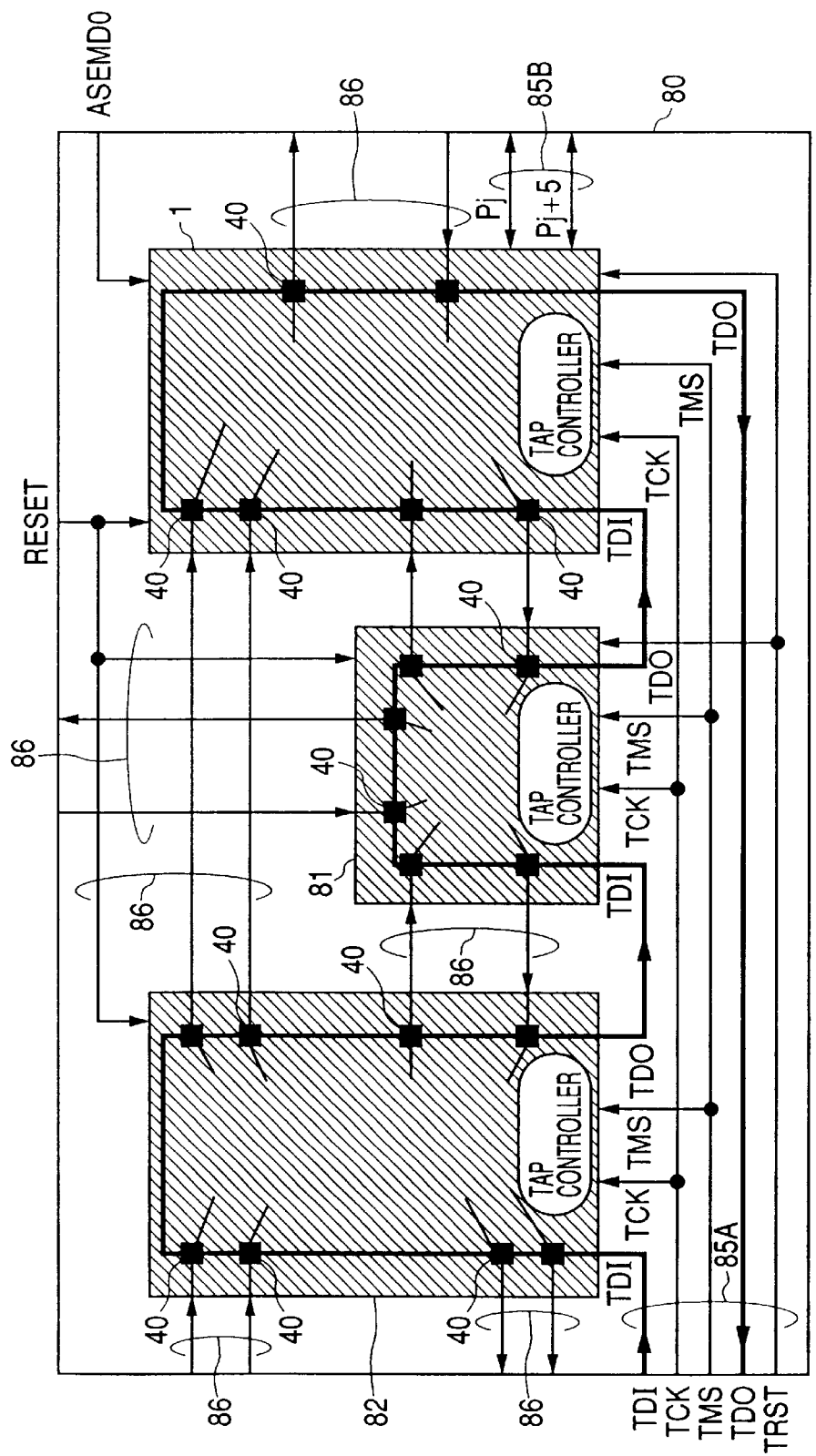
FIG. 19 is a block diagram illustrating an electronic circuit using the microcomputer.

FIG. 19 illustrates an example of the electronic circuit using the above microcomputer 1. The electronic circuit includes the microcomputer 1 as well as other semiconductor devices 81 and 82 mounted on the wiring board 80. In the microcomputer 1 as described above, the test access terminals for the boundary scanning are also used as other port terminals. The other semiconductor devices 81 and 82, too, have the boundary scanning function and their test access terminals may be the dedicated ones or may be the multi-use terminals as described above. In short, the test access terminals may be the dedicated ones when there is a margin in the number of the external terminals owing to the package size of the semiconductor device or when no compatibility is required concerning the arrangement of pins relative to the semiconductor device of the same kind without the boundary scanning function.

In FIG. 19, on the circuit board 80 are formed first wirings 85A and 85B to which are connected the multi-use terminals of the microcomputer 1, and a second wiring 86 to which are connected the external terminals except the multi-use terminals of the semiconductor device. The external terminals of the microcomputer 1 are arranged like an array on one surface of the package so as to be surface-mounted. Even when the external terminals are arranged in the form an array on the back surface of the package, the defective connection between the microcomputer 1 and the circuit board 80 can be easily verified by using the boundary scanning circuit. The first wiring 85A on the circuit board 80 is dedicated to the boundary scanning. When the boundary scanning function is used, therefore, the multi-use terminals P1 to P5 that are also used as test access terminals on the circuit board, are no longer utilizable for transmitting signals to the input/output port circuit. Therefore, the external terminals that are also used as the test access terminals are those external terminals that are assigned to inputting/outputting signals that are judged to be used less frequently. The situation is quite the same even for the external terminals Pj to Pj+5 that are also used for connection to the debugging circuit.

In the foregoing was concretely described the invention accomplished by the present inventors by way of an embodiment. The invention, however, is in no way limited thereto only but can be modified in a variety of other ways without departing from the gist of the invention.

For example, the kind of the module contained in the microcomputer and the constitution of the internal bus need not be limited to those described with reference to FIG. 2 but can be suitably changed. Further, the test access terminals are not limited to the above ones, and the reset terminal TRST may be omitted. Moreover, the test access terminals may be those that are not specified under IEEE Std 1149.1. Further, the CSP structure of the surface-mounting type is not limited to BGA only but may have any other external terminal structure.

INDUSTRIAL APPLICABILITY

The present invention is not limited to the microcomputer only but can be widely applied to any other semiconductor device furnished with the boundary scanning function or the debugging function.

What is claimed is:

1. A semiconductor device comprising an internal circuit, a port circuit connected to the internal circuit, external terminals to which the port circuit is connected, and a boundary scanning circuit, wherein the boundary scanning circuit is the one that makes access to the external terminals through test access terminals, the test access terminals are also used as predetermined external terminals among the external terminals, selection means is provided for selectively determining whether the multi-use terminals be connected to the port circuit or to the boundary scanning circuit, the selection means selecting, as an initial state, the state where the multi-use terminals are connected to the boundary scanning circuit in response to the power-on reset.

2. A semiconductor device comprising an internal circuit, a port circuit connected to the internal circuit, external terminals to which the port circuit is connected, and a boundary scanning circuit, wherein the boundary scanning circuit is the one that makes access to the external terminals through test access terminals, the test access terminals are also used as predetermined external terminals among the external terminals, selection means is provided for selectively determining whether the multi-use terminals be connected to the port circuit or to the boundary scanning circuit, the selection means initially determining the destinations of connection of the multi-use terminals depending upon the external condition at the time of power-on reset.

3. A semiconductor device according to claim 1, wherein the internal circuit includes a CPU, the CPU being capable of changing the state as selected by the selection means depending upon the operation program.

4. A semiconductor device comprising an internal circuit, a port circuit connected to the internal circuit, external terminals to which the port circuit is connected, and a boundary scanning circuit, wherein the boundary scanning circuit is the one that makes access to the external terminals through test access terminals, the test access terminals are also used as predetermined external terminals among the external terminals, selection means is provided for selectively determining whether the multi-use terminals be connected to the port circuit or to the boundary scanning circuit, the selection means including: a multiplexer that enables the multi-use terminals to be connected to either the boundary scanning circuit or the port circuit; and a port control register for initially setting the control data for determining the state to be selected by the multiplexer in response to the power-on reset operation.

5. A semiconductor device according to claim 4, wherein the state to be selected by the multiplexer at the time of power-on reset can be selected depending upon the state of a mode signal at the time of power-on reset.

6. A semiconductor device according to claim 5, wherein the internal circuit is provided with a CPU, and the port control register is accessible by the CPU through the internal bus, the port control register including: storage means for storing first control data for instructing the connection of the multi-use terminals to the port circuit and second control data for instructing the connection of the multi-use terminals to the boundary scanning circuit in synchronism with the power-on reset and in parallel; and a selection logic for determining either the first control data or the second control data be validated in response to the state of the mode signal at the time of power-on reset.

7. A semiconductor device according to claim 6, wherein: the boundary scanning circuit includes boundary scanning cells arranged to correspond to the external terminals and a boundary scan control circuit;

the test access terminals include a test access control terminal, a test access data input terminal and a test access data output terminal; and the boundary scan control circuit controls the transmission of signals to the external terminals corresponding to the boundary scanning cells according to the state of the test access control terminals, controls the shift of signals among the boundary scanning cells, controls the shift input of signals from the test access data input terminals to the boundary scanning cells, and controls the shift output of signals from the boundary scanning cells to the test access data output terminals.

8. A semiconductor device according to claim 4, wherein the internal circuit includes a CPU and a user break control circuit for halting the operation of instruction executed by the CPU, and the boundary scanning circuit supplies the break condition data input through the test access terminals to the user break control circuit.

9. A semiconductor device according to claim 8, wherein the internal circuit includes a debugging circuit that forms data for tracing the state of instruction executed by the CPU, the terminals for outputting the data for effecting the tracing formed by the debugging circuit to an external unit are also used as predetermined external terminals among the external terminals, and selection means is provided for determining whether the multi-use terminals be connected to the port circuit or to the debugging circuit.

10. A semiconductor device according to claim 9, wherein the external terminals are arranged in the form of an array on one surface of the package so that they can be surface-mounted.

11. A semiconductor device comprising an internal circuit including a CPU, a debugging circuit for debugging the state of the instruction executed by the CPU, a port circuit connected to the internal circuit, and external terminals to which the port circuit is connected, wherein the terminals for outputting the data formed by the debugging circuit to an external unit are also used as predetermined external terminals among the external terminals, and selection means is provided for determining whether the multi-use terminals be connected to the port circuit or to the debugging circuit.

12. An electronic circuit including: a semiconductor device which comprises an internal circuit, a port circuit connected to the internal circuit, external terminals to which the port circuit is connected, and a boundary scanning circuit, wherein the boundary scanning circuit is the one that makes access to the external terminals through test access terminals, the test access terminals are also used as predetermined external terminals among the external terminals, selection means is provided for selectively determining whether the multi-use terminals be connected to the port circuit or to the boundary scanning circuit, and a wiring board on which are formed a first wiring to which are connected the multi-use terminals of the semiconductor device and a second wiring to which are connected the external terminals except the multi-use terminals, the wiring board mounting the semiconductor device.

13. An electronic circuit according to claim 12, wherein the external terminals are arranged in the form of an array on one surface of the package so that they can be surface-mounted.

14. A semiconductor device comprising:

a first external terminal, a second external terminal, a first internal circuit, a second external terminal, a function-determining circuit for determining the function of the external terminals to couple the first external terminal to the first internal circuit in response to a signal of a first level input to the second external terminal and to couple the first external terminal to the second internal circuit in response to a signal of a second level different from the first level which is input to the second external terminal, and a third external terminal to which a reset signal is supplied, and wherein the function-determining circuit determines the function of the first external terminal in response to the reset signal supplied to the third external terminal, and wherein the second internal circuit includes a test control circuit.

15. A semiconductor device according to claim 14, wherein the first internal circuit includes the a data register.

16. A semiconductor device according to claim 14, wherein the test control circuit includes a boundary scan control circuit.

17. A semiconductor device according to claim 14, wherein the test control circuit includes a debugging control circuit.

18. A semiconductor device according to claim 2, wherein the internal circuit includes a CPU, the CPU being capable of changing the state as selected by the selection means depending upon the operation program.

* * * * *